(12) United States Patent
Yasuda et al.

(10) Patent No.: US 10,946,617 B2
(45) Date of Patent: Mar. 16, 2021

(54) GRAPHITE LAMINATED BODY

(71) Applicants: DU PONT-TORAY CO., LTD., Tokyo (JP); Panasonic Corporation, Osaka (JP)

(72) Inventors: Naofumi Yasuda, Aichi (JP); Noriko Toida, Aichi (JP); Naomi Nishiki, Kyoto (JP); Kazuhiro Nishikawa, Osaka (JP)

(73) Assignees: DU PONT-TORAY CO., LTD., Tokyo (JP); PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/032,347

(22) PCT Filed: Oct. 27, 2014

(86) PCT No.: PCT/JP2014/078446
§ 371 (c)(1),
(2) Date: Apr. 27, 2016

(87) PCT Pub. No.: WO2015/064519
PCT Pub. Date: May 7, 2015

(65) Prior Publication Data
US 2016/0279902 A1    Sep. 29, 2016

(30) Foreign Application Priority Data

Nov. 1, 2013  (JP) .............................. JP2013-228843
Nov. 1, 2013  (JP) .............................. JP2013-228844

(51) Int. Cl.
*B32B 9/04*     (2006.01)
*B32B 27/08*   (2006.01)
(Continued)

(52) U.S. Cl.
CPC ............... *B32B 9/007* (2013.01); *B32B 7/12* (2013.01); *B32B 9/045* (2013.01); *B32B 27/06* (2013.01);
(Continued)

(58) Field of Classification Search
CPC ......... B32B 27/08; B32B 9/007; B32B 9/045; B32B 27/32; B32B 27/322; B32B 27/20;
(Continued)

(56) References Cited

U.S. PATENT DOCUMENTS

2002/0021997 A1* 2/2002 Taomoto ............... C04B 41/009
                                                     423/448
2004/0058172 A1* 3/2004 Summers ................ B32B 15/08
                                                     428/473.5
(Continued)

FOREIGN PATENT DOCUMENTS

CN   103193221 A   * 7/2013  ............... C09K 5/14
EP   2 154 109         2/2010
(Continued)

OTHER PUBLICATIONS

Brewis and Dahm, Adhesion to Fluoropolymers, iSmithers Rapra Publishing, 2006, p. 36.*
(Continued)

*Primary Examiner* — John D Freeman
(74) *Attorney, Agent, or Firm* — Wenderoth, Lind & Ponack, L.L.P.

(57) ABSTRACT

Provided is a graphite laminated body having excellent properties such as excellent mechanical properties, excellent heat resistance, and excellent thermal conductivity. In particular, provided is a graphite laminated body comprising a graphite film, a non-thermoplastic polyimide film, and an adhesive layer for bonding the graphite film to the non-
(Continued)

thermoplastic polyimide film, the adhesive layer being made of a thermoplastic polyimide or a fluororesin.

18 Claims, 2 Drawing Sheets

(51) Int. Cl.
    *B32B 27/32* (2006.01)
    *H05K 1/05* (2006.01)
    *B32B 9/00* (2006.01)
    *B32B 7/12* (2006.01)
    *B32B 27/28* (2006.01)
    *B32B 27/20* (2006.01)
    *B32B 27/06* (2006.01)

(52) U.S. Cl.
    CPC .............. *B32B 27/08* (2013.01); *B32B 27/20* (2013.01); *B32B 27/281* (2013.01); *B32B 27/32* (2013.01); *B32B 27/322* (2013.01); *H05K 1/056* (2013.01); *B32B 2255/10* (2013.01); *B32B 2255/26* (2013.01); *B32B 2264/108* (2013.01); *B32B 2307/20* (2013.01); *B32B 2307/302* (2013.01); *B32B 2307/306* (2013.01); *B32B 2307/54* (2013.01); *B32B 2307/72* (2013.01); *B32B 2307/732* (2013.01); *B32B 2457/08* (2013.01); *H05K 2201/0129* (2013.01); *H05K 2201/0323* (2013.01)

(58) Field of Classification Search
    CPC ......... B32B 27/06; B32B 27/281; B32B 7/12; B32B 2457/08; B32B 2307/546; B32B 2264/108; B32B 2307/20; B32B 2264/102; B32B 2307/732; B32B 2307/72; B32B 2255/10; B32B 2255/26; B32B 2307/54; B32B 2307/302; B32B 2307/306; H05K 1/056; H05K 2201/0323; H05K 2201/0129
See application file for complete search history.

(56) References Cited

U.S. PATENT DOCUMENTS

| | | | |
|---|---|---|---|
| 2005/0100719 A1* | 5/2005 | Kanakarajan | B32B 15/08 428/209 |
| 2005/0118431 A1* | 6/2005 | Kono | C08F 214/26 428/421 |
| 2008/0090043 A1* | 4/2008 | Biller | B32B 37/10 428/41.8 |
| 2010/0196716 A1* | 8/2010 | Ohta | C09K 5/14 428/408 |
| 2012/0275731 A1* | 11/2012 | Ziegler | C22C 9/02 384/26 |
| 2013/0240777 A1* | 9/2013 | Yasuda | C09K 5/14 252/75 |

FOREIGN PATENT DOCUMENTS

| | | |
|---|---|---|
| JP | 1-49642 | 10/1989 |
| JP | 2002-12485 | 1/2002 |
| JP | 2004-17504 | 1/2004 |
| JP | 2005-186274 | 7/2005 |
| JP | 2008080672 A * | 4/2008 |
| JP | 2010-234556 | 10/2010 |

OTHER PUBLICATIONS

Daikin, Neoflon EFEP, Daikin Industries LTD, 2003, pp. 1-5 (Year: 2003).*

Nishikawa et al., JP-2008080672-A, Machine Translation (Year: 2008).*

International Preliminary Report on Patentability dated May 3, 2016 in International Application No. PCT/JP2014/078446.

International Search Report dated Jan. 27, 2015 in International Application No. PCT/JP2014/078446.

* cited by examiner

GRAPHITE LAMINATED BODY

TECHNICAL FIELD

The present invention relates to a graphite laminated body having excellent properties such as excellent mechanical properties, excellent heat resistance, and excellent thermal conductivity.

BACKGROUND ART

Small-sized heat-diffusing materials that require only a small space have been demanded for electronic devices with a small inner space and for devices that locally generate a large amount of heat. As such a material, a graphite film excellent in thermal conductivity in the surface direction has attracted attention.

Various types of graphite films with the above properties are known, including a sheet obtained by mixing graphite powder with a binder resin and a sheet obtained by rolling expanded graphite. Also known is a method for directly producing a flexible graphite sheet by subjecting a polyimide film as a raw material to heat treatment and rolling treatment (see, for example, Patent Literature 1). The graphite film obtained by this method is excellent in physical properties such as electrical conductivity and thermal conductivity. In particular, a graphite film produced by using a polyimide film as a raw material has a high quality, and is excellent in bending strength, flexibility, and thermal conductivity.

However, when a graphite sheet is directly used as a thermally conductive material inside electronic devices, an electrical short circuit may occur between the electronic components due to the electrical conductivity of the graphite sheet. Moreover, wearing away of the surface may create and disperse carbon powder, and the dispersed powder may electrically affect the device in a similar way to the above. In terms of mechanical strength, a graphite sheet may be insufficient in breaking strength, tensile strength, and the like depending on the purpose of use.

In order to prevent the inconvenience, a graphite composite film in which the surface of a graphite film is coated with a resin has been proposed (see, for example, Patent Literature 2).

However, when such a graphite composite film is used for a movable part, a bending part, or the like of a miniaturized electronic device and is subjected to repeated bending, the graphite film may be lifted from the coating layer, which may result in the decrease in heat dissipation properties of the graphite composite film. Moreover, the surface layer separated from the graphite film will contaminate the device.

Also known is a graphite composite film in which a resin film is bonded to the surface of a graphite film with an adhesive layer. When the adhesive layer is subjected to tight bending or repeated bending, the adhesive layer may deform due to its low strength, and consequently the graphite film may be lifted from the coating layer, or wrinkling, folding, and breaking of the graphite composite film may occur, all of which may result in the decrease in heat dissipation properties of the graphite composite film. Moreover, the surface layer separated from the graphite film will contaminate the device.

Furthermore, when an epoxy adhesive or an acrylic adhesive is used for, for example, a heat spreading sheet etc., the deterioration of the adhesive may cause peeling off of the sheet, which limits the usage of the sheet to the conditions at a temperature of 200° C. or less. Therefore, the sheet cannot be used for applications that are exposed to a high temperature, such as applications around an automotive engine control module or applications in a power device (such as IGBT) using silicon carbide (SiC).

For these reasons, the development of a further improved graphite composite film has been desired.

CITATION LIST

Patent Literature

Patent Literature 1: JP 1-49642 B
Patent Literature 2: JP 2002-12485 A

SUMMARY OF INVENTION

Technical Problem

An objective of the present invention is to provide a graphite laminated body having excellent properties such as excellent mechanical properties, excellent heat resistance, and excellent thermal conductivity in the surface direction, and being applicable to usage at a temperature higher than 200° C.

Solution to Problem

In order to solve the above problems, the present inventors carried out investigations, and consequently found that a highly thermally conductive graphite laminated body can be produced by providing a graphite film with a non-thermoplastic polyimide film and a thermoplastic polyimide or fluororesin adhesive layer for bonding the graphite film to the non-thermoplastic polyimide film. The inventors further advanced investigations based on the findings and completed the present invention.

That is, the present invention includes the following.
[1] A graphite laminated body comprising a graphite film, a non-thermoplastic polyimide film, and an adhesive layer for bonding the graphite film to the non-thermoplastic polyimide film, the adhesive layer being made of a thermoplastic polyimide or a fluororesin.
[2] The graphite laminated body according to the above [1], wherein the adhesive layer is made of a fluororesin and has a contact angle with water of 90 to 120 degrees.
[3] The graphite laminated body according to the above [1] or [2] wherein the adhesive layer is made of a fluororesin and has a melt flow rate of 40 g/10 min or less.
[4] The graphite laminated body according to any one of the above [1] to [3], wherein the graphite film is a film produced using a polymer film as a raw material.
[5] The graphite laminated body according to the above [4], wherein the polymer film is a polyimide film.
[6] The graphite laminated body according to any one of the above [1] to [5], wherein the non-thermoplastic polyimide film has a thermal expansion coefficient of 30 ppm/° C. or less.
[7] The graphite laminated body according to any one of the above [1] to [6], wherein the graphite film has a thermal conductivity of 200 W/m·K or more in the surface direction, and a thermal conductivity of 0.1 W/m·K or more in the thickness direction, and a ratio of the thermal conductivity in the surface direction to that in the thickness direction of 40 or more.
[8] The graphite laminated body according to any one of the above [1] to [7], which has a permittivity of 5 or less.

[9] The graphite laminated body according to any one of the above [1] to [6], wherein the non-thermoplastic polyimide film has a tensile elastic modulus of 3.0 GPa or more.

[10] The graphite laminated body according to any one of the above [1] and [4] to [9], wherein the thermoplastic polyimide comprises one or more types of thermoplastic polyimides selected from the group consisting of thermoplastic polyamide-imides, thermoplastic polyetherimides, silicone-modified polyimides, sulfonated polyimides, and thermoplastic polyesterimides.

[11] The graphite laminated body according to any one of the above [1] to [9], wherein the fluororesin contains tetrafluorcethylene-hexafluoropolypropylene copolymer.

[12] The laminated body according to any one of the above [1] to [11], which is used for a FPC board.

Advantageous Effects of Invention

The present invention provides a graphite laminated body comprising a graphite film and having excellent thermal conductivity in the surface direction and excellent properties such as excellent mechanical properties and heat resistance. According to the present invention, a polyimide film can be used in applications exposed to a high temperature, and therefore the present invention is applicable to usage at a temperature higher than 200° C.

BRIEF DESCRIPTION OF DRAWINGS

FIGS. 1a to 1c show different embodiments.

FIGS. 2a to 2c show different embodiments.

DESCRIPTION OF EMBODIMENTS

Figure 1:
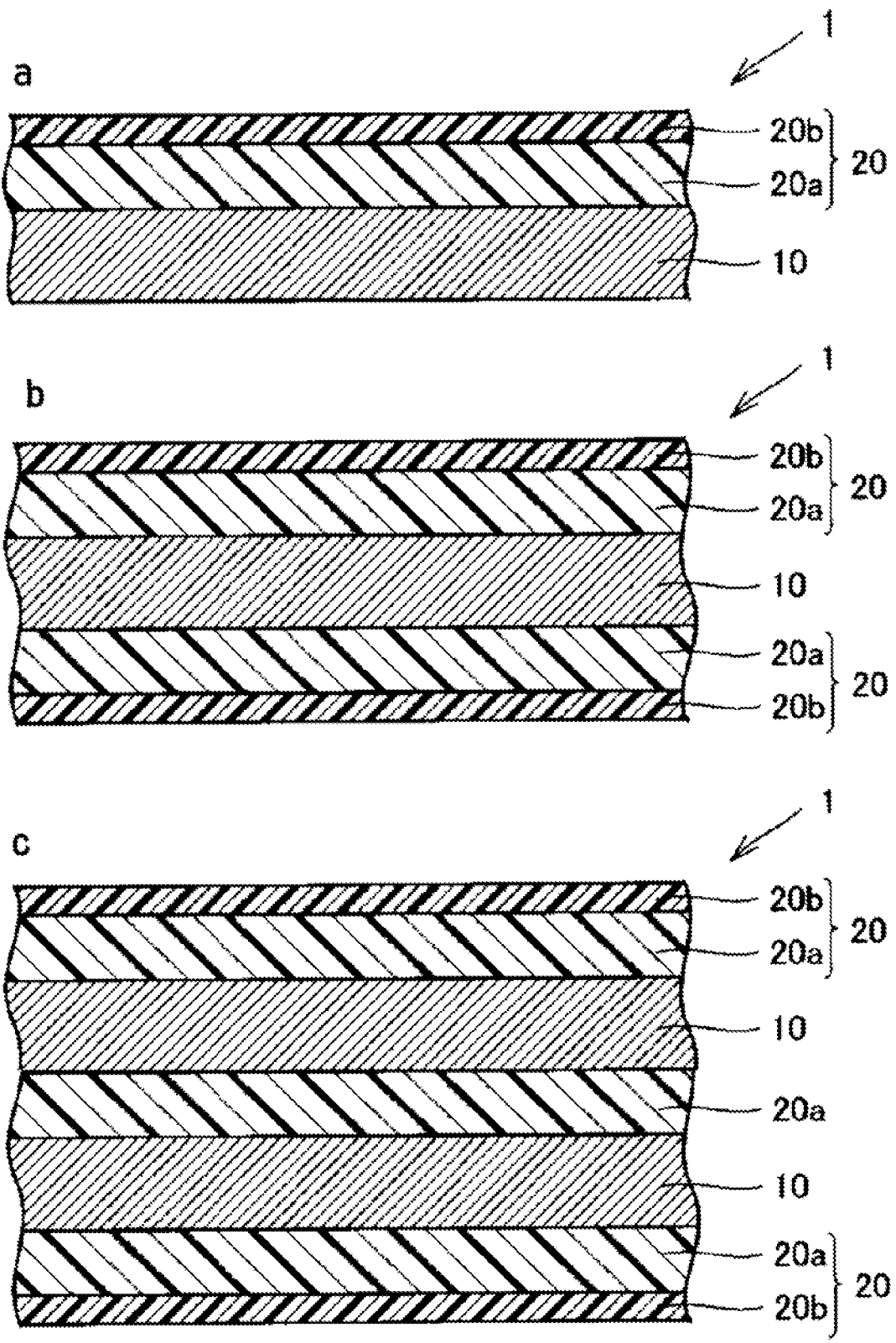
FIGS. 1a to 1c are schematic cross-sectional views showing various embodiments of the graphite laminated body according to the present invention.

As shown in FIGS. 1a to 1c, the graphite laminated body 1 of the present invention comprises a graphite film 10, a non-thermoplastic polyimide film 20b, and an adhesive layer 20a for bonding the graphite film 10 to the non-thermoplastic polyimide film 20b, the adhesive layer 20a being made of a thermoplastic polyimide or a fluororesin.

Also as shown in FIGS. 1a to 1c, in the graphite laminated body 1 of the present invention, the laminated part comprising the non-thermoplastic polyimide film 20b and the adhesive layer 20a is used as a protective film (a protective film 20) for the graphite film 10. The protective film 20 is, under normal conditions, bonded to at least one surface of the graphite film 10 so that the adhesive layer 20a is in contact with the graphite film 10.

Graphite Film 10

The graphite film 10 is not particularly limited in terms of structure, performance, and the like, and may be a generally commercially available graphite film. Graphite films suitable as the graphite film 10 include a graphite film obtained by the polymer pyrolysis method in which a polymer as a raw material of graphite is subjected to heat treatment, and a graphite film obtained by the expansion method in which natural graphite is expanded. The polymer pyrolysis method used herein means a method in which a film of a polymer (hereinafter, also referred to as a film as a raw material of graphite) such as polyoxadiazole, polyimide, polyphenylene vinylene, polybenzimiaazole, polybenzoxazole, polythiazole, and polyamide is subjected to heat treatment in an inert atmosphere of argon, helium, or the like and/or under reduced pressure. The expansion method is a method in which powder or flake natural graphite is immersed in an acid and then heated for expansion of the interlayer distance of the graphite, and the resulting expanded graphite is roll pressed.

The polymer pyrolysis method may be performed in any manner, and is preferably done by, for example, subjecting a film and/or a carbonized film as a raw material of graphite to heat treatment at 2000° C. or more to give a graphite film.

The graphite film produced by the expansion method using a powder as a starting material is poor in thermal conductivity and mechanical strength. Even when the graphite film is combined with a protective film, the resulting composite film is still poor in thermal conductivity and mechanical strength. Moreover, the graphite film produced by the expansion method will easily generate graphite particles on the surface, and therefore when combined with a protective film, the graphite film will not be tightly bonded to the protective film.

In contrast, the graphite film produced by the polymer pyrolysis method in which a film as a raw material of graphite, such as a polyimide film, is subjected to heat treatment is often excellent in thermal conductivity and strength due to the use of the film as a starting material. Therefore, when the graphite film is combined with a protective film, the resulting composite film is also excellent in thermal conductivity and mechanical strength. Moreover, the graphite film produced by the polymer pyrolysis method hardly generates graphite particles on the surface, and therefore when combined with a protective film, the graphite film will be tightly bonded to the protective film and will not separate from the interface between the graphite film and the protective film.

The thickness of the graphite film 10 is not particularly limited, but is 150 μm or less under normal conditions, preferably 100 μm or less, more preferably 50 μm or less, and particularly preferably 30 μm or less, when the graphite film having a thickness of 150 μm or less is combined with a protective film, the graphite film layer will not be lifted from the protective film layer, and therefore wrinkling, folding, or breaking will hardly occur. In the measurement of the thickness of the graphite film 10 described later, a 50 mm×50 mm piece was cut out from the film, and the thickness was measured at arbitrarily selected 10 points on the film surface with a thickness measuring gauge in a thermostatic chamber with a chamber temperature of 25° C. The average value was used as the measurement value. The thickness of the graphite film 10 means the thickness of one sheet of the graphite film 10 before the graphite film 10 is made into the graphite laminated body 1 of the present invention.

The tensile strength of the graphite film 10 is not particularly limited, but the tensile strength in the surface direction is 10 MPa or more under normal conditions, preferably 15 MPa or more, more preferably 18 MPa or more, and particularly preferably 20 MPa or more. The tensile elastic modulus of the graphite film 10 is not particularly limited, but the tensile elastic modulus in the surface direction is preferably 0.5 GPa or more, and more preferably 1 GPa or more, when the graphite film having a tensile elastic modulus (in the surface direction) of 0.5 GPa or more is combined with a protective film, the graphite film layer will not be lifted from the protective film layer, and therefore wrinkling, folding, or breaking will hardly occur. When a graphite with poor mechanical strength is used, the graphite easily breaks during the handling and is thus difficult to deal with, and may easily break during the use for a long period of time. However, the graphite film 10 used in the present invention has a tensile strength (in the surface direction) of 10 MPa or more, which means the film has sufficient film strength even when the thickness is small, and therefore the film does not break during the handling and/or use for a long period of time.

The tensile strength and tensile elastic modulus of the graphite film 10 were measured in accordance with JIS K 7161, as in the Examples described later.

The thermal conductivity in the surface direction of the graphite film 10 is not particularly limited, but is 200 W/m·K or more under normal conditions. In the present invention, it is important that the graphite film exhibits sufficiently high heat dissipation properties even when combined with a protective film and that the thermal conductivity of the graphite film is equal to or higher than that of copper (380 W/m·K), and therefore the thermal conductivity is preferably 400 W/m·K or more. The thermal conductivity in the thickness direction of the graphite film 10 is not particularly limited, but is 0.05 W/m·K or more under normal conditions, and preferably 0.1 W/m·K or more to exhibit sufficiently high heat dissipation properties even when the graphite film is combined with a protective film.

The ratio of the thermal conductivity of the graphite film 10 in the surface direction to that in the thickness direction is 60 or; more under normal conditions, preferably 50 or more, and more preferably 40 or more. The ratio is required to be at least 40 or more so that the heat locally generated by a heat generating component is diffused and dissipated within an electronic device. When the ratio is less than 40, a heat generating component is not stabilized. When the ratio is 60 or more, the heat is effectively diffused in almost any conditions and the stabilization of a heat generating component is ensured.

The thermal diffusivity in the surface direction of the graphite film 10 is not particularly limited, but is preferably $3.0 \times 10^{-4}$ m$^2$/s or more, more preferably $4.0 \times 10^{-4}$ m$^2$/s or more, and still more preferably $5.0 \times 10^{-4}$ m$^2$/s or more. The graphite film preferably has a thermal diffusivity of $3.0 \times 10^{-4}$ m$^2$/s or more to exhibit sufficiently high heat dissipation properties even when combined with a protective film.

The density of the graphite film 10 is not particularly limited, but is preferably 0.8 g/cm$^3$ or more, more preferably 1.5 g/cm$^3$ or more, and still more preferably 1.9 g/cm$^3$ or more. Generally, a graphite film with a high density has few irregularities on the surface and therefore the graphite film of the present invention with the above density will achieve very high bonding strength to a protective film.

Production Method of Graphite Film 10

The film used as a raw material of the graphite film 10 (film as a raw material of graphite) is not particularly limited, but is preferably a film made of at least one polymer selected from the group consisting of polyimide, polyamide, polyoxadiazole, polybenzothiazole, polybenzobisthiazole, polybenzoxazole, polybenzobisoxazole, polyparaphenylene vinylene, polybenzimidazole, polybenzobisimidazole, and polythiazole.

The film as a raw material of graphite is particularly preferably a polyimide film. A polyimide film is more easily carbonized and graphitized than other films as a raw material comprising other organic materials, and therefore the thermal diffusivity, the thermal conductivity, and the electrical conductivity will be higher than those in the case of using other raw materials. Moreover, graphite obtained from a polyimide film is excellent in crystallinity and heat resistance, and therefore a graphite film that hardly generates graphite particles on the surface and thus is easily bonded to a protective film will be easily obtained.

The method for producing a polyimide film suitable as a raw material of graphite may be exemplified by the thermal imidization method in which polyamide acid as a polyimide precursor is heated and converted into a polyimide, and the chemical imidization method in which polyamide acid is converted into a polyimide using, as an imidization accelerator, a dehydrating agent represented by acid anhydrides, such as acetic anhydride, and/or tertiary amines, such as picoline, quinolinen, isoquinoline, and pyridine. In particular, preferred is the chemical imidization method because of the facts that the resulting film has a small linear expansion coefficient and a high tensile elastic modulus, that graphitization rapidly proceeds at a relatively low temperature, and that a high-quality graphite is produced. The chemical imidization method allows more rapid imidization reaction and thus allows the completion of the imidization reaction in a short period of time with the aid of heating. Therefore the chemical imidization method is industrially advantageous and excellent in productivity.

Specifically, in the film production using the chemical imidization method, first, an imidization accelerator comprising more than stoichiometric amounts of a dehydrating agent and a catalyst is added to a polyamide acid solution. The solution is cast or applied onto a substrate, such as a support plate, an organic film such as a polyethylene terephthalate film, a drum, or an endless belt. The organic solvent is then evaporated to form a membrane having self-supporting properties. Subsequently, the self-supporting membrane is subjected to imidization under heating and drying to form a polyimide membrane. The temperature for the heat treatment is preferably within a range of 150 to 550° C. The rate of temperature rise in the heating is not particularly limited, but preferably the heating temperature is gradually elevated in a continuous or serial manner to reach the maximum temperature that is within the predetermined range. The duration of the heating depends on the film thickness and the maximum temperature, but is, in general, preferably within a range of 10 seconds to 10 minutes after the heating temperature reaches the maximum temperature. The polyimide film production process may include a step in which the film is brought into contact with a container, or fixed and held, or stretched in order to prevent the contraction of the film.

In the production of the graphite film 10 using the polymer pyrolysis method, first, a polymer film as a starting material serving as a raw material of graphite is subjected to pre-heat treatment under reduced pressure or in an inert gas to give a carbonized raw material film (carbonized film) (carbonization process). This pre-heating is performed at about 1000 to 2000° C. under normal conditions, and in an exemplary case where the temperature is raised at a rate of 10° C./min, the temperature is preferably maintained at 1000° C. for about 30 minutes. The inert gas is not particularly limited, and examples thereof include argon, helium, nitrogen, and the like.

The carbonized film is subjected to heat treatment in an inert atmosphere and/or under reduced pressure to give the graphite film 10.

The temperature for the heat treatment in the production method of the graphite film 10 is 2000° C. or more under normal conditions, preferably 2400° C. or more, more preferably 2600° C. or more, and still more preferably 2800° C. or more. In the case of using an industrial furnace commonly available at the moment, the maximum temperature for the heat treatment is about 3000° C.

The "temperature" described herein can be measured in, for example, a heater and/or a part of a treatment container, etc., using a radiation thermometer or the like. The term "heat treatment" used herein means heating under reduced pressure and/or heating in a gas atmosphere.

The production method of the graphite film 10 preferably further comprises a step of planarly applying a pressure on the graphitized film (i.e., the graphite film) obtained from the raw material through the graphitization process (posterior planar pressurization). This step enables the production of a graphite film having excellent thermal diffusivity, a high density, and excellent flatness without cracks, dents or wrinkles on the surface. The step of planarly applying a pressure can be performed also at room temperature. In this step, preferably the graphite film 10 is planarly pressurized together with another film-shaped medium.

The graphite film 10 may be a sheet graphite having flexibility or a block graphite. The shape of the graphite film 10 is not particularly limited, and the graphite film may be cut in accordance with a predetermined pattern.

Non-Thermoplastic Polyimide Film 20b

In the present invention, the non-thermoplastic polyimide means a polyimide which can be subjected to a lamination process with an existing apparatus and has a glass transition temperature of below 300° C.

The non-thermoplastic polyimide film 20b used in the present invention is not particularly limited, but preferably is those produced using, as raw materials, an aromatic diamine component and an acid anhydride component as described later.

The tensile elastic modulus of the non-thermoplastic polyimide film 20b is not particularly limited, but is preferably 3.0 GPa or more. The non-thermoplastic polyimide film 20b preferably has a melting point of 200° C. or more. In cases where the non-thermoplastic polyimide film 20b has a melting point of 200° C. or more and a tensile elastic modulus of 3.0 GPa or more, the protective film 20 will not be deformed during the bonding process to the graphite film 10 even when bonded at a temperature range of 50 to 200° C., and the resulting graphite laminated body 1 of the present invention will have no unevenness in the bonded part or no uneven thickness. That is, with the above setting, the deformation of the protective film 20 comprising the adhesive layer 20a and the non-thermoplastic polyimide film 20b is prevented at the time of melting of the adhesive layer 20a during the thermal bonding of the graphite film 10 and the protective film 20.

In particular, when the non-thermoplastic polyimide film 20b having a melting point of 200° C. or more is used, the resulting graphite laminated body 1 is excellent in durability. In cases where the tensile elastic modulus of the non-thermoplastic polyimide film 20b is 3.0 GPa or more, the graphite film 10 can be bonded to the adhesive layer 20a and the non-thermoplastic polyimide film 20b with a high pressure, and the resulting graphite laminated body 1 will have a high bonding properties. Moreover, in cases where the tensile elastic modulus of the non-thermoplastic polyimide film 20b is 3.0 GPa or more, folding or wrinkling of the resulting graphite laminated body 1 will hardly occur.

The coefficient of thermal expansion (CTE) of the non-thermoplastic polyimide film 20b is a value measured using TMA-50 manufactured by Shimadzu Corporation, in a temperature range of 50 to 200° C. and at a rate of temperature rise of 10° C./min. The CTE is not particularly limited, but in order to achieve a high dimensional stability of the non-thermoplastic polyimide film 20b, the CTE is 40 ppm/° C. or less under normal conditions, and preferably 30 ppm/° C. or less. When the CTE is over 40 ppm/° C., separation of layers, warp, and the like may occur due to the difference in the CTEs between the non-thermoplastic polyimide film 20b and the graphite 10. When the CTE is 30 ppm/° C. or less, bonding properties of the graphite 10 is ensured in almost any conditions.

In the production of the non-thermoplastic polyimide film 20b used in the present invention, first an aromatic diamine component is polymerized with an acid anhydride component in an organic solvent, to give a polyamic acid solution (hereinafter, also referred to as a polyamide acid solution).

Examples of the aromatic diamine component include p-phenylenediamine, m-phenylenediamine, benzidine, p-xylylenediamine, 4,4'-diaminodiphenyl ether, 3,4'-diaminodiphenyl ether, 4,4'-diaminodiphenylmethane, 4,4'-diaminodiphenyl sulfone, 3,3'-dimethyl-4,4'-diaminodiphenylmethane, 1,5-diaminonaphthalene, 3,3'-dimethoxybenzidine, 1,4-bis(3-methyl-5-aminophenyl) benzene, amide-forming derivatives thereof, and the like. These may be used alone or in combination of two or more kinds thereof. In the case of the application of the present invention to a circuit board, among the above diamines, those which have the effect of increasing the tensile elastic modulus of the film, such as p-phenylenediamine and 3,4'-diaminodiphenyl ether, are preferably used in adjusted amounts, thereby adjusting the tensile elastic modulus of the finally obtained polyimide film to 3.0 GPa or more. Among the above aromatic diamine components, p-phenylenediamine, 4,4'-diaminodiphenyl ether, and 3,4'-diaminodiphenyl ether are preferred. These may be used alone or in combination of two or more kinds thereof. When p-phenylenediamine and 4,4'-diaminodiphenyl ether and/or 3,4'-diaminodiphenyl ether are used in combination, the molar ratio of (i) 4,4'-diaminodiphenyl ether and/or 3,4'-diaminodiphenyl ether to (ii) p-phenylenediamine is more preferably 69/31 to 100/0, and particularly preferably 70/30 to 90/10.

Specific examples of the acid anhydride component include acid anhydrides of pyromellitic acid, 3,3',4,4'-biphenyltetracarboxylic acid, 2,3',3,4'-biphenyltetracarboxylic acid, 3,3',4,4'-benzophenonetetracarboxylic acid, 2,3,6,7-naphthalenedicarboxylic acid, 2,2-bis(3,4-dicarboxyphenyl) ether, pyridine-2,3,5,6-tetracarboxylic acid, amide-forming derivatives thereof, and the like. Among the above acid anhydrides, acid anhydrides of pyromellitic acid, 3,3',4,4'-biphenyltetracarboxylic acid, and 2,3',3,4'-biphenyltetracarboxylic acid are preferred. These may be used alone or in combination of two or more kinds thereof.

Preferable examples of the non-thermoplastic polyimide film 20b include a film comprising, as main components, one or more aromatic diamine components selected from the group consisting of p-phenylenediamine, 3,4'-diaminodiphenyl ether, and 4,4'-diaminodiphenyl ether, and one or more acid anhydride components selected from the group consisting of pyromellitic dianhydride and 3,3',4,4'-biphenyltetracarboxylic dianhydride.

Specific examples of the organic solvent used in the present invention for formation of the polyamic acid solution include sulfoxide-based solvents, such as dimethyl sulfoxide and diethyl sulfoxide, formamide-based solvents, such as N,N-dimethylformamide and N,N-diethylformamide, acetamide-based solvents, such as N,N-dimethylacetamide and N,N-diethylacetamide, pyrrolidone-based solvents, such as N-methyl-2-pyrrolidone and K-vinyl-2-pyrrolidone, phenol-based solvents, such as phenol, o-, m-, or p-cresol, xylenol, halogenated phenol, and catechol, and aprotic polar solvents, such as hexamethylphosphoramide and γ-butyrolactone. These are desirably used alone or as a mixture of two or more kinds thereof. In addition, aromatic hydrocarbons, such as xylene and toluene, may also be used.

Polymerization may be performed by any publicly known method, and examples of the method include the following.

(1) A polymerization method in which the whole amount of an aromatic diamine component is added to a solvent, and then an acid anhydride component in an amount equal to that of the aromatic diamine component is added to the mixture.

(2) A polymerization method in which the whole amount of an acid anhydride component is added to a solvent, and then an aromatic diamine component in an amount equal to that of the acid anhydride component is added to the mixture.

(3) A polymerization method in which an aromatic diamine component (a1) is added to a solvent, an acid anhydride component (b1) is added to the mixture so that its amount will be 95 to 105 mol % relative to the reactive component, the mixture is mixed for the time required for the completion of the reaction, then another aromatic diamine component (a2) is added to the mixture, and subsequently another acid anhydride component (b2) is added in such an amount that the total amount of the aromatic diamine components is nearly equal to the total amount of the acid anhydride components.

(4) A polymerization method in which an acid anhydride component (b1) is added to a solvent, an aromatic diamine component (a1) is added to the mixture so that its amount will be 95 to 105 mol % relative to the reactive component, the mixture is mixed for the time required for the completion of the reaction, then another acid anhydride component (b2) is added to the mixture, and subsequently another aromatic diamine component (a2) is added in such an amount that the total amount of the aromatic diamine components is nearly equal to the total amount of the acid anhydride components.

(5) A polymerization method performed as follow. An aromatic diamine component and an acid anhydride component are added to a solvent so that either one will be present in an excessive amount, and the mixture is brought into reaction to prepare a polyamide acid solution (A). In a separate container, another aromatic diamine component and another acid anhydride component are added in another solvent so that either one will be present in an excessive amount, and the mixture is brought into reaction to prepare a polyamide acid solution (B). The prepared polyamide acid solutions (A) and (B) are mixed to allow the polymerization to complete. In this method, when an excessive amount of the aromatic diamine component is used in the preparation of the polyamide acid solution (A), an excessive amount of the acid anhydride component is used in the preparation of the polyamide acid solution (B). Alternatively, when an excessive amount of the acid anhydride component is used in the preparation of the polyamide acid solution (A), an excessive amount of the aromatic diamine component is used in the preparation of the polyamide acid solution (B). The thus prepared polyamide acid solutions (A) and (B) are then mixed. In this manner, the total amount of the aromatic diamine components is adjusted to be nearly equal to the total amount of the acid anhydride components.

The polymerization method is not limited to the above methods, and may be other publicly known methods.

The polyamic acid solution obtained as described above has a solid content of 5 to 40% by weight under normal conditions, preferably a 10 to 30% by weight solid content. The viscosity is measured by a Brookfield viscometer and is 10 to 10000 Pa·s under normal conditions and is preferably 300 to 5000 Pa·s for stable feeding of the solution. The polyamic acid in an organic solvent solution may be partially imidized.

For improved heat dissipation properties, the non-thermoplastic polyimide film 20b may comprise a thermally conductive filler. Examples of a thermally conductive inorganic filler which provides improved thermal conductivity for the polyimide resin include carbon black (for example, channel black, furnace black, Ketjen black, and acetylene black), silica, alumina, aluminum borate, silicon carbide, boron carbide, titanium carbide, tungsten carbide, silicon nitride, boron nitride, aluminum nitride, titanium nitride, mica, potassium titanate, barium titanate, calcium carbonate, titanium oxide, magnesium oxide, zirconium oxide, tin oxide, antimony-doped tin oxide, indium tin oxide, talc, and the like. When the above thermally conductive filler other than graphite powder is used, the amount of the filler used is preferably 1 to 100 parts by weight, and more preferably 5 to 50 parts by weight relative to 100 parts by weight of the graphite powder.

The method for dispersing the thermally conductive filler in the polyimide resin is not particularly limited, and various publicly known methods can be used. For example, the thermally conductive filler may be added to the polyamic acid solution.

Next, the production method of the non-thermoplastic polyimide film 20b in the present invention using the polyamic acid solution will be described below.

Examples of the method for producing the non-thermoplastic polyimide film 20b include a method in which the polyamic acid solution is casted in the form of a film and then subjected to decyclization and desolvation under heating to give a polyimide film; and a method in which a cyclization catalyst and a dehydrating agent are added to the polyamic acid solution, then the mixture is subjected to chemical decyclization to form a gel film, and the film is desolvated under heating to give a polyimide film.

The polyamic acid solution may contain a cyclization catalyst (imidization catalyst), a dehydrating agent, a gelation retardant, and the like.

Specific examples of the cyclization catalyst used in the present invention include aliphatic tertiary amines, such as trimethylamine and triethylenediamine, aromatic tertiary amines, such as dimethylaniline, heterocyclic tertiary amines, such as isoquinoline, pyridine, and β-picoline, and the like. Preferred is at least one kind of amine selected from the heterocyclic tertiary amines.

Specific examples of the dehydrating agent used in the present invention include aliphatic carboxylic acid anhydrides, such as acetic anhydride, propionic anhydride, and butyric anhydride, aromatic carboxylic acid anhydrides, such as benzoic anhydride, and the like. Preferred are acetic anhydride and/or benzoic anhydride.

The examples of the method for producing a polyimide film from the polyamic acid solution also include a method in which the polyamic acid solution containing the cyclization catalyst and the dehydrating agent is extruded from a slit nozzle and casted on a substrate to form a film, the film on the substrata is subjected to partial imidization to convert the film into a gel film with self-supporting properties, and the gel film is removed from the substrate and subjected to dry heating/imidization and then heat treatment.

The substrate is a rotating drum or endless belt made of metal. The temperature of the substrate is controlled with a heat medium, such as a liquid or a gas and/or by radiation heat generated by an electric heater.

The gel film is heated by heat from the substrate and/or from a heat source, such as hot air and an electric heater, at 30 to 200° C. under normal conditions, preferably 40 to 150° C., thereby initiating ring closure reaction. The film is then dried to evaporate volatile components, such as free organic solvents, to give a film with self-supporting properties. The film is then removed from the substrate.

The gel film removed from the substrate may be, if required, subjected to stretching treatment in the running direction at a running speed controlled by a rotating roil. The stretching ratio in the machine direction (MDX) and the stretching ratio in the direction perpendicular to the machine direction (TDX) are 1.01 to 1.9 times under normal conditions, and preferably 1.05 to 1.6 times.

The film dried in a drying zone is heated by hot air, or with an infrared heater, or the like for 15 seconds to 10 minutes. The film is then subjected to heat treatment by hot air and/or with an electric heater, or the like at 250 to 500° C. for 15 seconds to 20 minutes. The thickness of the polyimide film can be controlled by adjusting the running speed.

The non-thermoplastic polyimide film 20b used in the present invention may be a commercially available product. The commercially available non-thermoplastic polyimide film is not particularly limited, and examples thereof include "Kapton" EN (e.g., "Kapton" 50EN-S (trade name, manufactured by DU PONT-TORAY CO., LTD.) and "Kapton" 100EN (trade name, manufactured by DU PONT-TORAY CO., LTD.)), "Kapton" H (e.g., "Kapton" 100H (trade name, manufactured by DU PONT-TORAY CO., LTD.)), and the like.

"Kapton" H is excellent in heat resistance, cold resistance, and electrical properties, and is broadly used for various types of circuit base materials, heat resistant insulating materials, and the like. "Kapton" EN is excellent in dimensional stability, and is frequently used for base materials for finer circuits.

Adhesive Layer 20a: Fluororesin

The fluororesin used as the adhesive layer 20a is not particularly limited, but in the case of applications to a high-frequency circuit board, a fluororesin having a melting point of 300° C. or less is preferred and a fluororesin having a melting point of 250° C. or less is more preferred to achieve sufficient bonding strength. The fluororesin used in the present invention is not particularly limited, and examples thereof include resins having a fluorinated structure, such as polytetrafluoroethylene (PTFE), tetrafluoroethylene-hexafluoropolypropylene copolymer (FEP), perfluoroalkoxy resin (PFA), ethylene-tetrafluoroethylene copolymer (ETFE), ethylene-chlorotrifluoroethylene copolymer (ECTFE), polychlorotrifluoroethylene (PCTFE), polyvinylidene fluoride (PVDF), and polyvinyl fluoride (PVF). Tetrafluorcethylene-hexafluoropolypropylene copolymer is preferred for its excellent adhesion properties. The above resins may be used alone or in combination of two or more kinds thereof.

When the fluororesin is used as the adhesive layer 20a, the adhesive layer 20a has a contact angle with water of 80 to 130 degrees under normal conditions, preferably 85 to 125 degrees, and more preferably 90 to 120 degrees, to achieve sufficient bonding strength in applications to a high-frequency circuit board, when the contact angle with water is below 80 degrees, the fluororesin wets the surface too much and a sufficient thickness of the resin cannot be achieved. When the angle is over 130 degrees, the fluororesin does not sufficiently wet the surface and hardly enters the irregularities on the surface of the graphite 10. The angle of 85 to 125 degrees is advantageous because a sufficient thickness of the resin is ensured and the fluororesin tightly bonds to the irregularities on the surface of the graphite 10.

When the fluororesin is used as the adhesive layer 20a, the adhesive layer 20a has a melt flow rate of 50 g/10 min or less under normal conditions, preferably 45 g/10 min or less, and more preferably 40 g/10 min or less, to achieve sufficient bonding strength in applications to a high-frequency circuit board. When the melt flow rate is over 50 g/10 min, the fluororesin is not intimate with the irregularities on the surface of the graphite 10 and does not enter the irregularities, leading to the failure of adhesion. When the melt flow rate is more than 45 g/10 min and 50 g/10 min or less, the fluororesin is partially intimate with the irregularities of the surface. When the melt flow rate is 40 g/10 min or less, the fluororesin is tightly bonded to any type of the graphite 10.

The fluororesin may be a commercially available product. The commercially available fluororesin is not particularly limited, but preferable examples thereof include "TOYOFLON" FEP (manufactured by Toray Advanced Film Co., Ltd.) and "NEOFLON" EFEP (manufactured by Daikin Industries, Ltd.).

As long as the fluororesin used as the adhesive layer contains a fluororesin as a main component, the fluororesin used as the adhesive layer may contain other publicly known thermoplastic resins to the extent that the effects of the present invention are not hindered. The thermoplastic resin is not particularly limited, but preferable examples thereof include polyester resins, polyamide resins, acrylic resins, epoxy resins, phenolic resins, and the like. The resins may be used alone or in combination of two or more kinds thereof. When another thermoplastic resin is contained, the fluororesin used as the adhesive layer is preferably a mixture of tetrafluoroethylene-hexafluoropolypropylene copolymer and a thermoplastic resin to achieve excellent adhesion properties.

Adhesive Layer 20a: Thermoplastic Polyimide

In the present invention, the thermoplastic polyimide used as the adhesive layer 20a is not particularly limited, and may be, for example, a publicly known thermoplastic polyimide obtained from a publicly known diamine and a publicly known acid dianhydride as described later. The production method of the thermoplastic polyimide is not particularly limited, and a publicly known method can be used. Examples thereof include the method described in JP 9-148695 A.

The thermoplastic polyimide used in the present invention means a polyimide having a glass transition temperature of 300° C. or more.

Preferable examples of the acid dianhydride include dicarboxylic anhydrides. The dicarboxylic anhydrides are not particularly limited, and examples thereof include pyromellitic dianhydride, 4,4'-oxydiphthalic dianhydride, 2,2'-bis(3,4-dicarboxyphenyl)hexafluoropropane dianhydride. 3,3',4,4'-benzophenonetetracarboxylic dianhydride, 3,3',4,4'-biphenyltetracarboxylic dianhydride, 2,2',3,3'-biphenyltetracarboxylic dianhydride, bis(3,4-dicarboxyphenyl)sulfonic dianhydride, bis(3,4-dicarboxyphenyl)sulfide dianhydride, bis(2,3-dicarboxyphenyl)methane dianhydride, bis(3,4-dicarboxyphenyl)methane dianhydride, 1,1-bis(2,3-dicarboxyphenyl)methane dianhydride, 1,1-bis(2,3-dicarboxyphenyl)propane dianhydride, 2,2-bis(3,4-dicarboxyphenyl)propane dianhydride, m-phenylenebis(trimellitic)

dianhydride, and the like. These may be used alone or in combination of two or more kinds thereof.

The diamine is not particularly limited, and examples thereof include hexamethylenediamine, heptamethylenediamine, 3,3'-dimethylpentamethylenediamine, 3-methylhexamethylenediamine, 3-methylheptamethylenediamine, 2,5-dimethylhexamethylenediamine, octamethylenediamine, nonamethylenediamine, 1,1,6,6-tetramethylhexamethylanediamine, 2,2,5,5-tetramethylhexamethylenediamine, 4,4-dimethylheptamethylenediamine, decamethylenediamine, m-phenylenediamine, 4,4'-diaminobenzophenone, 4-aminopheny-3-aminobenzoate, m-aminobenzoyl-p-aminoanilide, 4,4'-diaminodiphenyl ether, 3,4'-diaminodiphenyl ether, bis(4-aminophenyl)methane, 1,1-bis(4-aminophenyl)ethane, 2,2-bis(4-aminophenyl)propane, 2,2'-bis(4-(4-aminophenoxy)phenyl)propane, 4,4'-diaminodiphenylsulfoxide, 3,3'-diaminobenzophenone, 1,3-bis(4-aminophenoxy)benzene, 2,2'-diaminobenzophenone, 1,2-bis(4-aminophenoxy)benzene, 1,3-bis(4-aminobenzoyloxy)benzene, 4,4'-dibenzanilide, 4,4'-bis(4-aminophenoxy)phenylether, 2,2'-bis(4-aminophenyl)hexafluoropropane, 2,2'-bis(4-aminophenyl)-1,3-dichloro-1,1,3,3-hexafluoropropane, 4,4'-diaminodiphenyl sulfone, 1,12-diaminododecane, 1,13-diaminododecane, polysiloxane diamine, and the like. These may be used alone or in combination of two or more kinds thereof.

Among the above compounds, the thermoplastic polyimide used in the present invention is particularly preferably a copolymer of 1,3-bis(4-aminophenoxy)benzene (also referred to as RODA) with pyromellitic dianhydride (also referred to as PMDA) and 4,4'-oxydiphthalic dianhydride (ODPA), a copolymer of 4,4'-diaminodiphenyl ether (also referred to as ODA) and 3,3',4,4'-biphenyltetracarboxylic dianhydride (also referred to as BPDA), a copolymer of ODA with PMDA and BPDA, and a copolymer of 3,3',4,4'-benzophenonetetracarboxylic dianhydride (BTDA) with PMDA and 2,2'-bis[4-(4-aminophenoxy)phenyl]propane (also referred to as BAPP).

For the purpose of the improvement of the tensile elastic modulus of the polyimide or other purposes, a publicly known maleimide compound (e.g., a bismaleimide compound) may be added to a thermoplastic polyimide precursor (e.g., polyimide varnish) to the extent that the effects of the present invention are not hindered.

As long as the thermoplastic polyimide used as the adhesive layer comprises a thermoplastic polyimide as a main component, the thermoplastic polyimide used as the adhesive layer may contain other publicly known thermoplastic resins to the extent that the effects of the present invention are not hindered. The thermoplastic polyimide is not particularly limited, and the thermoplastic polyimide used as the adhesive layer may contain other thermoplastic polyimides, such as a thermoplastic polyamide-imide, a thermoplastic polyetherimide, a silicone-modified polyimide, a sulfonated polyimide, and a thermoplastic polyesterimide. The thermoplastic polyimides can be used alone or in combination of two or more kinds thereof.

As long as the thermoplastic polyimide used as the adhesive layer contains a thermoplastic polyimide as a main component, the thermoplastic polyimide used as the adhesive layer may contain other thermoplastic resins. The thermoplastic resin is not particularly limited, but preferable examples thereof include polyester resins, polyamide resins, acrylic resins, epoxy resins, and phenolic resins. These may be used alone or in combination of two or more kinds thereof. When another thermoplastic resin is contained, the thermoplastic polyimide used as the adhesive layer is preferably a mixture of tetrafluoroethylene-hexafluoropolypropylene copolymer and a thermoplastic resin to achieve excellent adhesion properties.

Graphite Laminated Body 1

One example of the graphite laminated body 1 of the present invention is, as shown in FIG. 1a, a graphite laminated body having a configuration of the protective film 20 (formed of the non-thermoplastic polyimide film 20b/the adhesive layer 20a)/the graphite film 10. Another embodiment is, as shown in FIG. 1b, a graphite laminated body having a configuration of the protective film 20 (formed of the non-thermoplastic polyimide film 20b/the adhesive layer 20a)/the graphite film 10/the protective film 20 (formed of the adhesive layer 20a/the non-thermoplastic polyimide film 20b). In the above configurations, the slash mark "/" indicates that both ends of the films and the adhesive layer connected with the slash mark are thermally bonded. In order to improve the bonding between the graphite film 10 and the protective film 20, the protective film 20 preferably has a structure in which the protective film 20 covers a part or the whole of the surface 10r of the graphite film 10, as shown in FIG. 2a.

Figure 2:
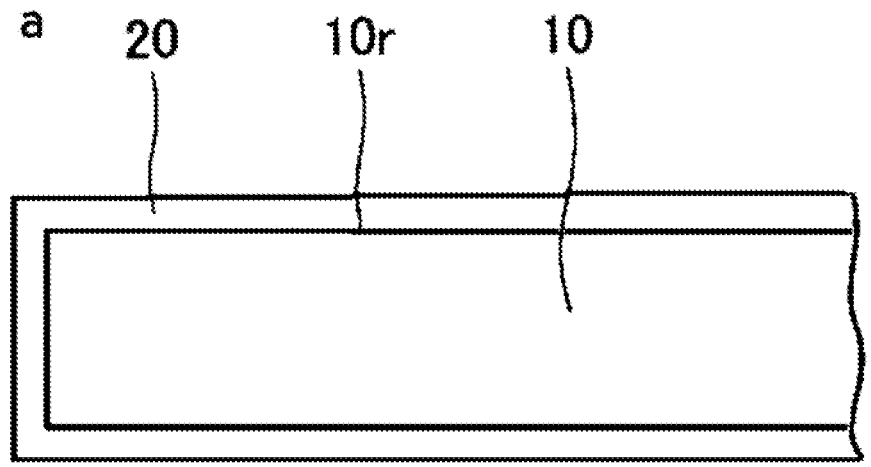
FIGS. 2a to 2c are schematic plan views showing various embodiments of the graphite laminated body according to the present invention.
Figure 2:
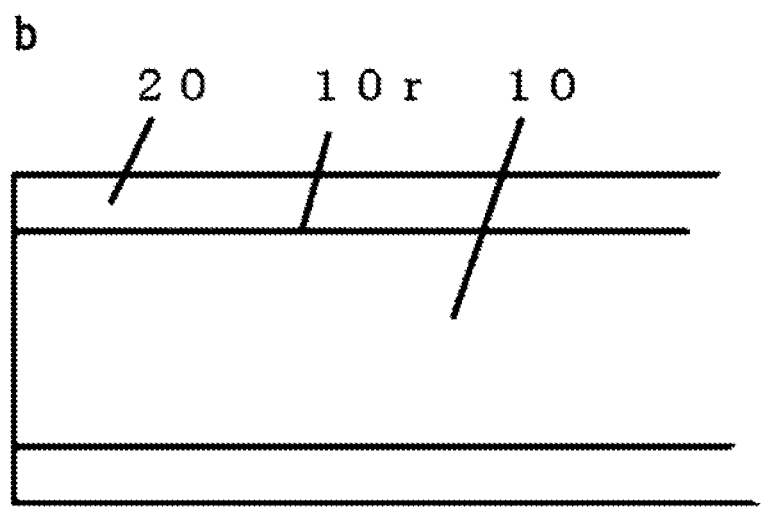
Figure 2:
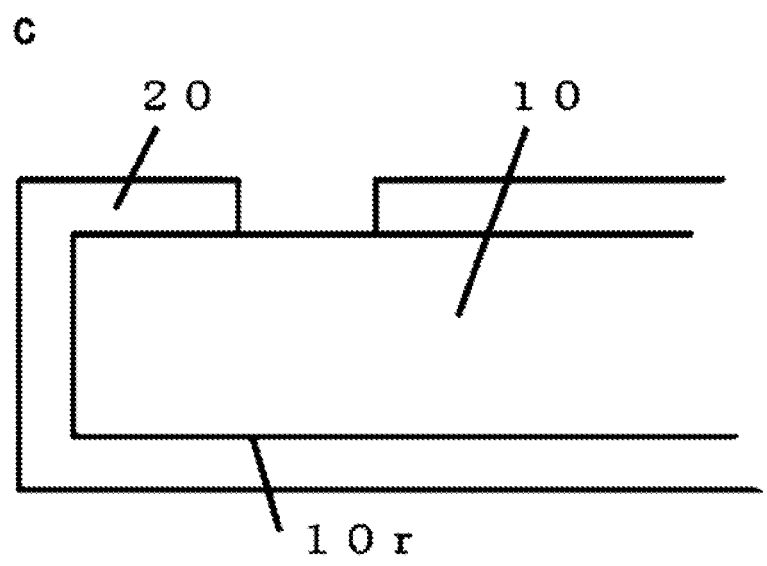

The protective film 20, as shown in FIG. 2b, may have another structure in which the protective film 20 covers a part or the whole of the surface 10r of the graphite film 10, in particular, the protective film 20 covers at least one side of the surface 10r corresponding to the MD end of the graphite film 10. The protective film 20, as shown in FIG. 2c, may have another structure in which the protective film 20 covers a part or the whole of the surface 10r of the graphite film 10 and a part of the protective film 20 is cut out along the surface 10r.

In cases where two sheets of the graphite films 10 are used to form the graphite laminated body 1 of the present invention, examples of the graphite laminated body 1 include a laminated film in which one sheet of the adhesive layer 20a is sandwiched between the graphite films 10, and the protective films 20 each consist of one sheet of the adhesive layer 20a and one sheet of the non-thermoplastic polyimide film 20b (shown in FIG. 1c).

The protective film 20, which comprises the adhesive layer 20a and the non-thermoplastic polyimide film 20b, is only required to have a structure in which the adhesive layer 20a is formed on at least one surface of the non-thermoplastic polyimide film 20b. The protective film 20 comprising the non-thermoplastic polyimide film 20b has a high mechanical strength, and thus prevents the breakage of the protective film. The adhesive layer 20a has thermal bondability. That is, since the protective film 20 comprises the adhesive layer 20a, the protective film 20 has thermal bondability.

In the graphite laminated body 1 of the present invention, the protective film 20 comprising the adhesive layer 20a is bonded to the graphite film 10 by thermal bonding as shown in FIGS. 1a to 1c, and therefore the graphite film 10 does not come off from the adhesive layer 20a of the protective film 20, and folding or wrinkling of the graphite film 10 does not occur. In contrast, in cases where a graphite-polyimide laminated film is produced by using a protective film containing an adhesive layer as the adhesive layer 20a instead of the thermoplastic polyimide or the fluororesin, and where a graphite film is bonded to the protective film by adhesive bonding at room temperature (e.g., 25° C.), folding or wrinkling of the laminated body easily occurs. This is because the adhesive layer for bonding at room temperature has a fluidity at room temperature and thus easily deforms.

In the graphite laminated body 1 of the present invention, the thickness of the adhesive layer 20a is 1 to 70 μm under normal conditions, and preferably 2 to 50 μm. The thickness of the non-thermoplastic polyimide film 20b is 1 to 30 μm under normal conditions, preferably 3 to 50 μm, and more preferably 5 to 25 μm, to achieve adequate film-forming properties. The thickness of the protective film 20 is not particularly limited, but is preferably 5 μm or more, and may be 10 μm or more, to provide excellent strength and to prevent deformation and breakage.

In the present invention, the production method of the graphite laminated body 1 is not particularly limited, and the graphite laminated body 1 can be produced by heat bonding (thermal bonding) the graphite film 10, the adhesive layer 20a and the non-thermoplastic polyimide film 20b so that the graphite film 10 is bonded to the non-thermoplastic polyimide film 20b via the adhesive layer 20a. When the graphite film 10 and the protective film 20 are bonded by heating, the adhesive layer 20a of the protective film 20 is melted and infiltrates the graphite film 10, leading to strong bonding between the films. However, since the graphite film 10 has a layered structure and a graphite layer is easily separated from the surface, thermal bonding at a high temperature will facilitate the separation of the graphite layer from the surface of the graphite film 10.

The bonding method is not particularly limited, and examples thereof include a method in which the graphite film 10, the thermoplastic polyimide or the fluororesin used as the adhesive layer 20a, and the non-thermoplastic polyimide film 20b are roll laminated together or pressed together in batches, and the like. The examples also include a method in which the thermoplastic polyimide or the fluororesin used as the adhesive layer 20a is applied onto the graphite film 10, and the resulting film is bonded to the non-thermoplastic polyimide film 20b by pressing or lamination.

The melt bonding temperature of the adhesive layer 20a of the present invention is preferably within a range of 200 to 400° C., and more preferably within a range of 220 to 380° C. The temperature within the above ranges is advantageous because the graphite film 10 will be sufficiently tightly bonded to the adhesive layer 20a.

In the bonding of the protective film 20 to the graphite film 10, the protective film 20 does not need to cover the whole surface of the graphite film 10. The part of the graphite film 10 that is to be in contact with a heat generating part and/or a cooling part does not need to be covered with the protective film 20, and in this case it is advantageous if the protective film 20 is provided with an opening corresponding to the part of the graphite film 10.

In cases where the graphite laminated body 1 of the present invention is attached to another material, at least one surface of the graphite laminated body 1 may be simply attached to the material via an adhesive tape, a sticky tape, or a double-sided adhesive tape. The material to be attached to the graphite laminated body is not particularly limited, and the graphite laminated body 1 can be attached to various kinds of materials. Examples of the material to be attached to the graphite laminated body 1 include, in particular, flexible printed circuit (FPC) boards and the like.

In cases where the graphite laminated body 1 having an opening is fixed to a heat generating part and/or a cooling part, an adhesive tape, a sticky tape, or a double-sided adhesive tape may be attached to the opening. If an adhesive tape, a sticky tape, or a double-sided adhesive tape is attached exclusively to the opening of the graphite film, folding of the graphite film may occur at the time of removing the release paper from the tape. For this reason, it is advantageous that an adhesive tape, a sticky tape, or a double-sided adhesive tape is attached so as to cover a part of the protective film.

The thickness of the graphite laminated body 1 of the present invention (the total thickness of the graphite laminated body 1) is preferably 160 μm or less, more preferably 120 μm or less, and particularly preferably 100 μm or less. The thickness of the graphite laminated body 1 is preferably 160 μm or less to be usable in devices with a small inner space, such as a mobile device and a semiconductor package.

The thermal conductivity in the surface direction of the graphite laminated body 1 is preferably 1.0 W/m·K or more, more preferably 2.0 W/m·K or more, and particularly preferably 5.0 W/m·K or more. The thermal conductivity in the surface direction is preferably 1.0 W/m·K or more to effectively dissipate the accumulated heat from a heat generating component mounted on a board and to effectively spread the heat unevenly applied by a fixing belt, thereby preventing increase in the temperature of the rear surface of the board and increasing the fixing speed.

The thermal conductivity in the thickness direction of the graphite laminated body 1 is preferably 0.15 W/m·K or more, and more preferably over 0.25 W/m·K. The thermal conductivity in the thickness direction is preferably within the above range to effectively dissipate the accumulated heat from a heat generating component mounted on a board and to effectively spread the heat unevenly applied by a fixing belt, thereby preventing increase in the temperature of the rear surface of the board and increasing the fixing speed.

The ratio of the thermal conductivity in the surface direction to that in the thickness direction (the thermal conductivity in the surface direction/the thermal conductivity in the thickness direction) of the graphite laminated body 1 of the present invention is 100 or more under normal conditions, preferably 500 or more, and more preferably 1500 or more. The ratio of the thermal conductivity in the surface direction to that in the thickness direction is preferably 5 or more to effectively dissipate the accumulated heat from a heat generating component mounted on a board and to effectively spread the heat unevenly applied by a fixing belt, thereby preventing increase in the temperature of the rear surface of the board and increasing the fixing speed. The ratio of the thermal conductivity in the surface direction to that in the thickness direction is preferably 4000 or less.

The coefficient of thermal expansion (CTE) of the graphite laminated body 1 is a value measured using TMA-50 manufactured by Shimadzu Corporation, in a temperature range of 50 to 200° C. and at a rate of temperature rise of 10° C./min. The CTE is 9 to 40 ppm/° C. under normal conditions, and preferably 10 to 30 ppm/° C.

The permittivity of the graphite laminated body 1 is not particularly limited, but is 6 or less under normal conditions, preferably 5.5 or less, and more preferably 5 or less. The permittivity is a value measured by the method in the Examples described later.

The graphite laminated body 1 according to the present invention is a film produced by bonding the graphite film 10 having the above properties to the protective film 20 comprising the adhesive layer 20a and the non-thermoplastic polyimide film 20b, and the thus produced film exhibits excellent thermal diffusion properties.

In the graphite laminated body 1 according to the present invention, the non-thermoplastic polyimide film 20b may be further stacked on a metal layer. Examples of the metal include copper, copper alloy, and the like.

The application of the graphite laminated body 1 according to the present invention is not particularly limited, but preferable examples thereof include applications around an automotive engine control module, applications in a power device (such as IGBT) using silicon carbide (SiC), applications in a heat spreading sheet, electromagnetic-wave shielding applications, applications in a high-frequency device, an inverter, and a motor, and the like. Specific examples thereof include applications in a heat spreading sheet for a heat spot on a FPC board and a CPU (central processing unit), and the like.

EXAMPLES

The present invention will be described more specifically with reference to Examples, but the present invention is not limited to these Examples. Various modifications may be made within the technical idea of the present invention by those who have ordinary knowledge in the art.

Thermal Conductivity in Surface Direction and in Thickness Direction

The thermal conductivity in the surface direction or in the thickness direction is calculated by the following formula: $\lambda = \alpha \times d \times Cp$. In the formula, $\lambda$ represents the thermal conductivity, $\alpha$ represents the thermal diffusivity, $d$ represents the density, and $Cp$ represents the specific heat capacity. The thermal diffusivity in the surface direction, the thermal diffusivity in the thickness direction, the density, and the specific heat capacity of a film can be calculated by the methods described below.

Measurement of Thermal Diffusivity in Surface Direction

A 3 mm×30 mm sample piece was cut out from a film and the thermal diffusivity in the surface direction was measured on the piece in an atmosphere at 25° C. and at an AC frequency of 10 Hz with a thermal diffusivity measuring apparatus using a laser-heating AC method ("LaserPit" available from ULVAC-RIKO, Inc.).

Measurement of Thermal Diffusivity in Thickness Direction

A sample piece having a diameter of 20 mm was cut out from a film and the piece was subjected to blackening treatment by coating the both surfaces with carbon using a carbon spray. The thermal diffusivity in the thickness direction was measured on the resulting piece with LFA 447 NanoFlash manufactured by Bruker Corporation in an atmosphere at 25° C.

Density Measurement

The density of a film was determined by first calculating the volume (cm³) by multiplying the length, the width and the thickness together, and then dividing the weight (g) by the volume (cm³).

Thickness Measurement

The thickness was measured at arbitrarily selected 10 points on a 50 mm×50 mm film with a thickness measuring gauge (VL-50A, manufactured by Mitutoyo Corporation) in a thermostatic chamber with a chamber temperature of 25° C. The average value of the measurements was used as the measurement value of the film thickness.

Specific Heat Measurement

The specific heat of a film was measured with a differential scanning calorimeter DSC-7 manufactured by PerkinElmer Co., Ltd. under the following conditions.

Rate of temperature rise: 10° C./min
Reference sample: sapphire
Atmosphere: dry nitrogen flow
Measurement temperature: 25° C.

Permittivity Measurement

The permittivity of a graphite laminated body was measured with a precision LCR meter HP4284A (manufactured by Agilent Technologies, Inc.) under the following conditions.

Electrode for measurement: SE-70 (manufactured by Ando Electric Co., Ltd.)

Sample piece size: 50 mm×60 mm

Electrode shape: main electrode diameter 38 mm, guard electrode diameter 50 mm, counter electrode 60×46 mm (gap between the main electrode and the guard electrode: 1 mm)

Electrode material: main electrode and guard electrode: conductive paste; counter electrode: aluminum (evaporated aluminum)

Measurement frequency: 1 MHz

Measurement environment: room temperature (22° C./60% RH)

Measurement of Tensile Strength and Tensile Elastic Modulus

The tensile strength and tensile elastic modulus of a film and a graphite film were measured with an automatic strength and elongation testing machine for films (RTA-100, manufactured by Orientec Co., Ltd.) in accordance with JIS K 7161.

Contact Angle Measurement

The contact angle was measured by the θ/2 method with CA-X manufactured by Kyowa Interface Science Co., Ltd.

Melt Flow Rate

The melt flow rate was measured at a measurement temperature of 380° C. in accordance with ASTM D3307.

Production Method of Graphite Film A

A "Kapton" 300H film with a size of 100 mm (width)×100 mm (length)×75 μm (thickness) was interposed between graphite plates, and was heated to 1000° C. in an electric furnace to allow carbonization (carbonization treatment). One hundred sheets of the thus prepared carbonized films were piled upon one another, then interposed between graphite plates, and heated to 2900° C. or more in a graphitization furnace to allow graphitization. Thus 100 sheets of individual graphite films A were obtained (thickness: 30 μm, density: 1.86 g/cm³, thermal diffusivity (in the surface direction): 9.1 cm²/s, thermal conductivity (in the surface direction): 1000 W/m·K, tensile elastic modulus (in the surface direction): 1.1 GPa, tensile strength (in the surface direction): 22 MPa).

Production Method of Graphite Film B

Graphite films B (thickness: 10 μm, density: 2.18 g/cm³, thermal diffusivity (in the surface direction): 12.5 cm²/s, thermal conductivity (in the surface direction): 1500 W/m·K, tensile elastic modulus (in the surface direction): 700 GPa, tensile strength (in the surface direction): 55 MPa) were produced by performing graphitization in the same manner as in the production of the graphite films A except that "Kapton" 100H was used instead of "Kapton" 300H in the preparation of carbonized films.

The physical properties of the graphite films A and E are shown in Table 1.

TABLE 1

Physical properties of graphite films

| | | Film as raw material of graphite | Thickness (μm) | Density (g/cm$^3$) | Thermal Diffusivity (in surface direction) (cm$^2$/s) | Thermal Conductivity (in surface direction) (W/m · K) | Tensile Elastic modulus (in surface direction) (GPa) | Tensile strength (in surface direction) (MPa) |
|---|---|---|---|---|---|---|---|---|
| Graphite film | A | Kapton 300H film | 30 | 1.86 | 9.1 | 1000 | 1.1 | 22 |
| | B | Kapton 100H film | 10 | 2.18 | 12.5 | 1500 | 700 | 55 |

Graphite Laminated Body
In the Case of Using Adhesive Layer Made of Fluororesin Protective Film In cases where an adhesive layer is made of a fluororesin, a protective film A to be bonded to a graphite film consists of a "Kapton" 50H film (thickness: 12.5 μm, tensile elastic modulus (in the surface direction): 3.2 GPa) and a "TOYOFLON" FEP film (thickness: 12.5 μm). A protective film B consists of a "Kapton" 50H film (thickness: 12.5 μm, tensile elastic modulus (in the surface direction): 3.2 GPa) and a "NEOFLON" EFEP film (thickness: 50 μm).

Example 1

The protective film A/the graphite film A/the protective film A were bonded together by application of a pressure of 3 MPa at 320° C. for 5 minutes. The resulting laminated body was left in an atmosphere at 250° C. for 30 minutes, but no change was observed.

Example 2

The protective film A/the graphite film B/the protective film A were bonded together by application of a pressure of 3 MPa at 320° C. for 5 minutes. The resulting laminated body was left in an atmosphere at 250° C. for 30 minutes, but no change was observed.

Example 3

The protective film B/the graphite film A/the protective film B were bonded together by application of a pressure of 1 MPa at 260° C. for 1 minute. The resulting laminated body was left in an atmosphere at 230° C. for 30 minutes, but no change was observed.

Example 4

The protective film B/the graphite film B/the protective film B were bonded together by application of a pressure of 1 MPa at 260° C. for 1 minute. The resulting laminated body was left in an atmosphere at 230° C. for 30 minutes, but no change was observed.

Example 5

The protective film A/the graphite film B/the "TOYOFLON" FEP film (thickness: 12.5 μm)/the graphite film B/the protective film A were bonded together by application of a pressure of 3 MPa at 320° C. for 5 minutes. The resulting laminated body was left in an atmosphere at 250° C. for 30 minutes, but no change was observed.

Comparative Example 1

The "Kapton" 50H film/the graphite film A/the "Kapton" 50H film were bonded together without the fluororesin by application of a pressure of 3 MPa at 320° C. for 5 minutes. However, these films failed to be bonded and a laminated body was not able to be obtained.

Comparative Example 2

The "Kapton" 50H film (thickness: 12.5 μm, tensile elastic modulus (in the surface direction): 3.2 GPa) and a "Pyralux" LF0100 film (thickness: 25 μm) were used as a protective film C, and the protective film C/the graphite film A/the protective film C were bonded together by application of a pressure of 3 MPa at 170° C. for 30 minutes. After the resulting laminated body was left in an atmosphere at 230° C. for 30 minutes, the bonded surfaces deformed and consequently the films in the laminated body separated from each other.

The configurations of the protective films A to C are shown in Table 2.

TABLE 2

Configurations of protective films A to C

| Protective film | A | B | C |
|---|---|---|---|
| Configuration | | | |
| Non-thermoplastic polyimide film 20b | Kapton 50H film | Kapton 50H film | Kapton 50H film |
| Adhesive layer 20a | TOYOFLON FEP film (fluororesin) | NEOFLON EFEP film (fluororesin) | Pyralux LF0100 film (non-fluorine resin) |

The configurations, thicknesses, permittivity, and thermal conductivity of the graphite laminated bodies produced in Examples 1 to 5 and Comparative Examples 1 and 2 are summarized in Table 3 below.

TABLE 3

Configurations, thicknesses, permittivity, and thermal conductivity of graphite laminated bodies

|  |  | Example 1 | Example 2 | Example 3 | Example 4 | Example 5 | Comparative Example 1 | Comparative Example 2 |
|---|---|---|---|---|---|---|---|---|
| Configuration | Protective film | Protective film A | Protective film A | Protective film B | Protective film B | Protective film A | "Kapton" 50H film | Protective film C |
|  | Graphite film | Graphite film A | Graphite film B | Graphite film A | Graphite film B | Graphite film B "TOYOFLON" FEP film Graphite film B | Graphite film A | Graphite film A |
|  | Protective film | Protective film A | Protective film A | Protective film B | Protective film B | Protective film A | "Kapton" 50H film | Protective film C |
| Total thickness (μm) |  | 80 | 60 | 155 | 135 | 82.5 | Laminated body was not obtained | Film Separation occurred |
| Permittivity |  | 4.5 | 4.5 | 4.4 | 4.4 | 4.5 |  |  |
| Thermal conductivity in surface direction (W/m · K) |  | 400 | 800 | 400 | 800 | 1000 |  |  |
| Thermal conductivity in thickness direction (W/m · K) |  | 2.5 | 0.5 | 2.5 | 0.5 | 0.4 |  |  |

As is apparent from the above results, in Comparative Example 1, the protective film had no fluororesin layer and consequently a graphite laminated body was not able to be formed, and in Comparative Example 2, the films in the laminated body separated from the bonded surfaces when used at 200° C. or more.

In contrast, no change was observed in the graphite laminated bodies obtained in Examples 1 to 5 even when they were used at 200° C. or more, and therefore it was revealed that the laminated bodies were able to be used at 200° C. or more and were excellent in heat resistance.

It was also revealed that the laminated bodies obtained in Examples 1 to 5 had a permittivity of 5 or less, a thermal conductivity in the surface direction of 200 W/m·K or more. That is, the laminated bodies had excellent thermal conductivity in the surface direction. The laminated bodies had a thermal conductivity in the thickness direction of 0.1 W/m·K or more.

In the Case of Using Adhesive Layer Made of Thermoplastic Polyimide

Synthesis Example of Thermoplastic Polyimide A

To dimethylacetamide as a solvent was added 1,3-bis(4-aminophenoxy)benzene, and the mixture was stirred until complete dissolution. Subsequently, to the solution, 4,4'-dioxydiphthalic anhydride was added and the mixture was stirred to give a polyamic acid solution as a thermoplastic polyimide A. The solid content in the dimethylacetamide was 15%, and the Tg was 217° C.

Protective Film

For the purpose of obtaining a protective film containing a thermoplastic polyimide as an adhesive layer, a protective film D to be bonded to a graphite film was produced by applying the polyamic acid solution as a thermoplastic polyimide A onto the "Kapton" 50H film (thickness: 12.5 μm, tensile elastic modulus (in the surface direction): 3.2 GPa) so that the coating thickness after drying would be about 2 μm, and heating the film at 150° C. for 10 minutes and then at 350° C. for 1 minute to allow imidization. A protective film E was produced by applying a thermoplastic polyimide A onto the "Kapton" 50EN film (thickness: 12.5 μm, tensile elastic modulus (in the surface direction): 5.5 GPa) so that the coating thickness after drying would be about 2 μm, and heating the film at 150° C. for 10 minutes and then at 350° C. for 1 minute to allow imidization.

Example 6

The protective film D/the graphite film A/the protective film D were bonded together by application of a pressure of 10 MPa at 380° C. for 5 minutes. The resulting laminated body was left in an atmosphere at 250° C. for 30 minutes, but no change was observed.

Example 7

The protective film D/the graphite film B/the protective film D were bonded together by application of a pressure of 10 MPa at 380° C. for 5 minutes. The resulting laminated body was left in an atmosphere at 250° C. for 30 minutes, but no change was observed.

Example 8

The protective film E/the graphite film A/the protective film E were bonded together by application of a pressure of 10 MPa at 380° C. for 5 minutes. The resulting laminated body was left in an atmosphere at 250° C. for 30 minutes, but no change was observed.

Example 9

The protective film E/the graphite film B/the protective film E were bonded together by application of a pressure of 10 MPa at 380° C. for 5 minutes. The resulting laminated body was left in an atmosphere at 250° C. for 30 minutes, but no change was observed.

TABLE 4

Configurations of protective films D and E

| Protective film |  | D | E |
|---|---|---|---|
| Configuration | Non-thermoplastic polyimide film 20b | Kapton 50H film | Kapton 50EN film |
|  | Adhesive layer 20a | Thermoplastic polyimide A | Thermoplastic polyimide A |

The configurations, thicknesses, and thermal conductivity of the graphite laminated bodies produced in Examples 6 to 9 are summarized in Table 5 below.

TABLE 5

Configurations, thicknesses, and thermal conductivity of graphite laminated bodies

|  | Example 6 | Example 7 | Example 8 | Example 9 |
|---|---|---|---|---|
| Configuration | Protective film D<br>Graphite film A<br>Protective film D | Protective film D<br>Graphite film B<br>Protective film D | Protective film E<br>Graphite film A<br>Protective film E | Protective film E<br>Graphite film B<br>Protective film E |
| Total thickness (μm) | 60 | 40 | 60 | 40 |
| Thermal conductivity in surface direction (W/m · K) | 400 | 800 | 400 | 800 |
| Thermal conductivity in thickness direction (W/m · K) | 2.5 | 0.5 | 2.5 | 0.5 |

As mentioned above, no change was observed in the graphite laminated bodies obtained in Examples 6 to 9 even when they were used at 200° C. or more, and therefore it was revealed that the laminated bodies were able to be used at 200° C. or more and were excellent in heat resistance.

It was also revealed that the laminated bodies obtained in Examples 6 to 9 had a thermal conductivity in the surface direction of 200 W/m·K or more. That is, the laminated bodies had excellent thermal conductivity in the surface direction. The laminated bodies had a thermal conductivity in the thickness direction of 0.1 W/m·K or more.

As is apparent from the above results, the graphite laminated body of the present invention has excellent properties such as excellent mechanical properties, excellent heat resistance, and excellent thermal conductivity in the surface direction, and shows the anisotropy of the thermal conductivity in the surface and thickness directions.

INDUSTRIAL APPLICABILITY

The graphite laminated body of the present invention has excellent properties such as excellent mechanical properties, excellent heat resistance, and excellent thermal conductivity in the surface direction, and shows the anisotropy of the thermal conductivity in the surface and thickness directions. Therefore the graphite laminated body is useful as a material for an electronic component.

REFERENCE SIGNS LIST

1: Graphite laminated body
10: Graphite film
10r: Surface of graphite film
20: Protective film
20a: Adhesive layer
20b: Non-thermoplastic polyimide film

The invention claimed is:

1. A graphite laminated body comprising a graphite film, a first non-thermoplastic polyimide film which is bonded on one side of the graphite film, a first adhesive layer bonding the graphite film to the first non-thermoplastic polyimide film, a second non-thermoplastic polyimide film which is bonded on the other side of the graphite film, and a second adhesive layer bonding the graphite film to the second non-thermoplastic polyimide film, wherein the graphite film consists of graphite, wherein the first and second adhesive layers are made of a fluororesin, have a contact angle with water of 90 to 120 degrees, have a thickness of 12.5 to 70 μm, and have a melt flow rate of 40 g/10 min. or less, wherein the first and second adhesive layers are in direct contact with the graphite film, and wherein the first non-thermoplastic polyimide film and the first adhesive layer are bonded only on the one side of the graphite film, and the second thermoplastic polyimide film and the second adhesive layer are bonded only on the other side of the graphite film.

2. The graphite laminated body according to claim 1, wherein the graphite film is a film produced using a polymer film as a raw material.

3. The graphite laminated body according to claim 2, wherein the polymer film is a polyimide film.

4. The graphite laminated body according to claim 1, wherein least one of the first and second non-thermoplastic polyimide films has a thermal expansion coefficient of 30 ppm/° C. or less.

5. The graphite laminated body according to claim 1, wherein the graphite film has a thermal conductivity of 200 W/m·K or more in the surface direction, and a thermal conductivity of 0.1 W/m·K or more in the thickness direction, and a ratio of the thermal conductivity in the surface direction to that in the thickness direction of 40 or more.

6. The laminated body according to claim 1, which has a permittivity of 5 or less.

7. The graphite laminated body according to claim 1, wherein least one of the first and second non-thermoplastic polyimide films has a tensile elastic modulus of 3.0 GPa or more.

8. The graphite laminated body according to claim 1, wherein the adhesive layer further comprises at least one thermoplastic polyimide selected from the group consisting of a thermoplastic polyimide, a thermoplastic polyamide-imide, a thermoplastic polyetherimide, a silicone-modified polyimide, a sulfonated polyimide, and a thermoplastic polyesterimide.

9. The graphite laminated body according to claim 1, wherein the fluororesin comprises tetrafluoroethylene-hexafluoropolypropylene copolymer.

10. The graphite laminated body according to claim 1, which is used for a FPC board.

11. The graphite laminated body according to claim 1, wherein the graphite film is a graphite film obtained by heat treatment of a polymer film.

12. The graphite laminated body according to claim 1, wherein the graphite film has a thermal diffusivity of $3.0 \times 10^{-4}$ m$^2$/s or more.

13. The graphite laminated body according to claim 1, wherein the graphite film has a density of 0.8 g/cm$^3$ or more.

14. The graphite laminated body according to claim 1, comprising the graphite film as a first graphite film, and further comprising a second graphite film and a third adhesive layer,
wherein the first non-thermoplastic polyimide film is bonded on one side of the first graphite film via the first adhesive layer and the other side of the first graphite film is bonded to the second graphite film via the second adhesive layer, and
the second non-thermoplastic polyimide film is bonded on one side of the second graphite film via the third adhesive layer and the other side of the second graphite film is bonded to the first graphite film via the second adhesive layer.

15. The graphite laminated body according to claim 1, comprising the graphite film as a first graphite film, and further comprising a second graphite film and a third adhesive layer made of a fluororesin or a thermoplastic polyimide,
- wherein the first non-thermoplastic polyimide film is bonded on one side of the first graphite film via the first adhesive layer and the other side of the first graphite film is bonded to the second graphite film via the second adhesive layer, and
- the second non-thermoplastic polyimide film is bonded on one side of the second graphite film via the third adhesive layer and the other side of the second graphite film is bonded to the first graphite film via the second adhesive layer.

16. The graphite laminated body according to claim 1, wherein the first and second adhesive layers are compositionally identical.

17. The graphite laminated body according to claim 1, wherein the first and second non-thermoplastic polyimide films are compositionally identical.

18. The graphite laminated body according to claim 1, wherein a structure of the first non-thermoplastic polyimide film and the first adhesive layer is identical to a structure of the second non-thermoplastic polyimide film and the second adhesive layer.

* * * * *